(12) United States Patent
Yun et al.

(10) Patent No.: US 10,624,228 B2
(45) Date of Patent: Apr. 14, 2020

(54) RACK MOUNT CASE STORAGE SYSTEM SEPARABLY COUPLED TO BODY

(71) Applicant: STORAGEAN, INC., Seongnam-si (KR)

(72) Inventors: Dong Goo Yun, Seoul (KR); Hwang Sup Kim, Seoul (KR)

(73) Assignee: STORAGEAN, INC., Seongnam-si (KR)

( * ) Notice: Subject to any disclaimer, the term of this patent is extended or adjusted under 35 U.S.C. 154(b) by 0 days.

(21) Appl. No.: 16/468,920

(22) PCT Filed: Sep. 27, 2017

(86) PCT No.: PCT/KR2017/010683
§ 371 (c)(1),
(2) Date: Jun. 12, 2019

(87) PCT Pub. No.: WO2018/110809
PCT Pub. Date: Jun. 21, 2018

(65) Prior Publication Data
US 2019/0320547 A1    Oct. 17, 2019

(30) Foreign Application Priority Data

Dec. 15, 2016 (KR) .................. 10-2016-0171681
Aug. 9, 2017 (KR) .................. 10-2017-0100828

(51) Int. Cl.
*H05K 7/14* (2006.01)
*H05K 7/18* (2006.01)

(52) U.S. Cl.
CPC .......... *H05K 7/1491* (2013.01); *H05K 7/1418* (2013.01); *H05K 7/1488* (2013.01); *H05K 7/183* (2013.01)

(58) Field of Classification Search
CPC .. H05K 7/1485; H05K 7/1487; H05K 7/1488; H05K 7/1489
(Continued)

(56) References Cited

U.S. PATENT DOCUMENTS 6,025,989 A    2/2000   Ayd et al.
6,126,255 A *  10/2000  Yang ................. A47B 88/60
                                                    312/334.44
(Continued)

FOREIGN PATENT DOCUMENTS

JP      2015038800      2/2015
JP      2016505998      2/2016
KR      20140102295     8/2014

OTHER PUBLICATIONS

International Search Report—PCT/KR2017/010683 dated Jan. 30, 2018.
(Continued)

*Primary Examiner* — Adrian S Wilson
(74) *Attorney, Agent, or Firm* — Cantor Colburn LLP

(57) ABSTRACT

Provided is a rack mount case storage system separably coupled to a body, wherein, constituting the storage system, a SATA interface based-3.5 inch storage media and a PCIe interface based-3.5 inch storage media are both accommodated in a front case, thereby forming a high-capacity hybrid Bay structure; and a power supply module for supplying power to the storage system of the present invention, as well as a HOST Computer interface card, a storage extension module, a RAID card, and some storage media, which are components for performing various controls of the storage system, are mounted in a rear case.

12 Claims, 9 Drawing Sheets

(58) Field of Classification Search
USPC .................................................. 361/724-728
See application file for complete search history.

(56) References Cited

U.S. PATENT DOCUMENTS

| | | | | |
|---|---|---|---|---|
| 6,535,381 B2* | 3/2003 | Jahne | ....................... | G06F 1/184 |
| | | | | 312/223.1 |
| 6,611,424 B2* | 8/2003 | Huang | .................. | G11B 33/128 |
| | | | | 248/224.51 |
| 6,628,513 B1* | 9/2003 | Gallagher | .............. | G06F 1/184 |
| | | | | 361/679.33 |
| 6,661,671 B1* | 12/2003 | Franke | ..................... | G06F 1/189 |
| | | | | 361/679.02 |
| 6,999,306 B2* | 2/2006 | Walczak | ................... | G06F 1/18 |
| | | | | 211/126.11 |
| 7,349,204 B2* | 3/2008 | Tanaka | .................... | G06F 1/181 |
| | | | | 361/679.33 |
| 7,359,186 B2* | 4/2008 | Honda | ................... | G11B 33/142 |
| | | | | 361/679.33 |
| 7,362,565 B2* | 4/2008 | Imblum | .................. | G06F 1/184 |
| | | | | 361/679.33 |
| 7,375,923 B2* | 5/2008 | DeCenzo | .............. | G11B 33/128 |
| | | | | 360/73.01 |
| 7,864,539 B2* | 1/2011 | Dunham | ................. | G06F 1/187 |
| | | | | 312/223.1 |
| 8,720,043 B2 | 5/2014 | Corddry et al. | | |
| 8,773,861 B2 | 7/2014 | Ross et al. | | |
| 8,867,214 B2 | 10/2014 | Ross et al. | | |
| 2003/0147220 A1* | 8/2003 | Fairchild | ................. | G06F 1/184 |
| | | | | 361/726 |
| 2005/0219826 A1* | 10/2005 | Carlson | ................ | G11B 33/126 |
| | | | | 361/724 |
| 2007/0230111 A1* | 10/2007 | Starr | .................... | G11B 33/125 |
| | | | | 361/679.31 |
| 2007/0247804 A1* | 10/2007 | Li | ........................ | G11B 33/126 |
| | | | | 361/679.48 |
| 2009/0231806 A1 | 9/2009 | Lee | | |
| 2010/0265645 A1 | 10/2010 | Wang et al. | | |
| 2014/0203696 A1* | 7/2014 | Rust | ....................... | G11B 33/02 |
| | | | | 312/330.1 |
| 2014/0204525 A1* | 7/2014 | Pecone | .................. | H05K 13/00 |
| | | | | 361/679.33 |
| 2014/0204537 A1* | 7/2014 | Rust | ....................... | H05K 7/02 |
| | | | | 361/727 |

OTHER PUBLICATIONS

Korean Office Action—Korean Application No. 10-2017-0100828 dated Dec. 6, 2019, citing KR 10-2014-0102295, US 2010/0265645 and JP 2016-505998.

* cited by examiner

RACK MOUNT CASE STORAGE SYSTEM SEPARABLY COUPLED TO BODY

TECHNICAL FIELD

The present invention relates to a rack mount case storage system in which a front case and a rear case are detachable.

BACKGROUND ART

In general, storage systems based on a rack mount case include a main body having one structure and include a series of storage media, a redundant array of independent disk (RAID) card, a motherboard, a power supply module, and a cooling fan therein so as to constitute a storing system.

Therefore, when the capacity of the storage media is full, it is not easy to separate each of the storage media having a RAID configuration from the main body and store the storage media such that physical positions are not mixed with each other or to reconstruct each of the stored storage media to a state before the storage media are separated from the main body.

In addition, recently, as a main storage medium has been converted from a hard disk drive (for example, a hard disk drive (HDD), solid state drive (SSD) doubler, or the like) to an SSD based on a semiconductor-based unit storage element such as a NAND-flash, unlike the HDD, SSD doubler, or the like, in a natural neglected and stored state, the SSD may be stored for only a period of several weeks to several months due to the characteristic transition of a gate that maintains a memory state of a semiconductor storage element. In order to solve such a problem, there is a need for a separate independent storage case for long term storage of a separate storage medium.

In this case, a separate long term storage case does not require components such as a motherboard and a RAID card, but includes a power supply module configured to supply power.

In addition, in an integrated type main body structure, expensive core controllers including a motherboard, a RAID card, and a power supply module, which are core components of a storage system, constitute a main body together with a series of storage media, and thus, there is a problem in that components of the controller may not be utilized for long term storage as the main body stands.

DISCLOSURE

Technical Problem

The present invention is directed to allowing a user to selectively accommodate a 3.5-inch storage medium (for example, a hard disk drive (HDD), solid state drive (SSD) doubler, or the like) based on an serial AT attachment (SATA) interface and an SSD-based 3.5-inch storage medium (for example, an SSD tripler, M2 multiplier, or the like) based on a peripheral component interconnect express (PCIe) interface to form a 64-bay hybrid bay structure in a hybrid storage system based on a high capacity rack mount case. In addition, the present invention is directed to providing a rack mount case storage system having a detachable body in which a part mounted with a series of storage media and a control part including a power supply module are detached and used as needed.

Technical Solution

According to an embodiment of the present invention, a rack mount case storage system having a detachable body includes a front case which accommodates a first storage medium, includes a bay-row board having a multi-stage arrangement structure and including a first connection portion and a second connection portion for a connection with adjacent board, and is configured such that one or more front cases are coupled; one or more power supply modules; a power multiplexing board which includes a power supply module connection portion connected to correspond to the power supply module and a third connection portion configured to connect power and an interface signal to the front case, wherein the third connection portion is connected to the second connection portion which is adjacent thereto and is provided in the front case, receives power supplied from the power supply module, and supplies the received power to the front case; a rear case which includes the power supply modules and the power multiplexing board; and a slide rail portion which is fixed to each of both side surfaces of the front case and the rear case and couples the front case and the rear case, wherein the front case or the rear case is detached or coupled as needed.

The rear case including the power multiplexing board may further include a fourth connection portion which protrudes in a direction opposite to the third connection portion and transmits power and an interface signal.

The rack mount case storage system may further include a base board which is coupled to the fourth connection portion provided on the power multiplexing board and includes a peripheral component interconnect (PCI) express slot for an external interface and a PCI express slot for an internal interface to form a controller, wherein a PCI express slot portion is formed outside the rear case so as to correspond to the PCI express slot.

At least one rear 2-bay module configured to mount a second storage medium may be mounted at an upper end of the rear case, wherein power and an interface control signal is connected between the rear 2-bay module and the base board through a vertical connection board which is further provided.

The first storage medium and the second storage medium may be concurrently accommodated only in the front case by mounting the second storage medium provided at the upper end of the rear case on a second storage medium corresponding bay provided at a lower end of the front case.

The rack mount case storage system may further include a storage extension module which is connected to a PCI express slot provided to be used for an extension module provided on the base board.

The rack mount case storage system may further include one or more PCI express slot connectors which are connected to at least one PCI express slot connector constituting the PCI express slot portion provided on the base board through an electric circuit wiring and is disposed in a direction of 90° such that a redundant array of independent disk (RAID) card is mounted.

A cooling fan may be provided on a front surface of a bracket of the RAID card such that an air flow is parallel to a direction of the RAID card.

The power multiplexing board may further include a power extension board between the power supply module and the power supply module connection portion so as to correspond to a length of the power supply module and may connect the power supply module and the power supply module connection portion.

A main body grip hole may be formed in a central upper end point of each of both side surfaces of the front case to provide convenience when the front case is installed and may be covered by a covering portion such as a slide rail when a product is installed.

According to a use purpose of the first storage medium mounted on the front case, when the first storage medium of the front case is for long term storage, the rear case may be mounted with only the power supply module on the power multiplexing board and is coupled to the front case, When the first storage medium is stored for a long term and intermittent data access is required, the rear case may include the power supply module, the base board connected to the fourth connection portion, a low performance interface card, and a lower performance RAID card mounted on the base board and may be coupled to the front case, and normally, the rear case commonly may include the power supply module, the base board connected to the fourth connection portion, a high performance interface card, and a high performance RAID card mounted on the base board and may be coupled to the front case.

According to an embodiment of the present invention, a couple-type rack system includes a front case which is mounted with a series of storage media and is configured such that one or more front cases are coupled; a rear case which is mounted with a power supply module and is coupled to the front case; and unit racks which are extended to be coupled to each other and mount and accommodate a storage system formed by the front case and the rear case being coupled.

Advantageous Effects

The present invention is directed to allowing a user to selectively accommodate a 3.5-inch storage medium (for example, a hard disk drive (HDD), solid state drive (SSD) doubler, or the like) based on a serial AT attachment (SATA) interface and an SSD-based 3.5-inch storage medium (for example, an SSD tripler, M2 multiplier, or the like) based on a peripheral component interconnect express (PCIe) interface to construct one or more front cases having a 64-bay hybrid bay structure in a multi-stage in a hybrid storage system based on a high capacity rack mount case. In addition, the present invention is directed to providing a rack mount case storage system having a detachable body in which a part mounted with a series of storage media and a control part including a power supply module are detached and used as needed.

In addition, according to the present invention, it is possible to form a 64-bay hybrid bay structure by commonly accommodating an SSD-based 3.5-inch storage medium (for example, an HDD, SSD doubler, or the like) based on a SATA interface and an SSD-based storage medium (for example, an SSD tripler, M2 multiplier, or the like) based on a PCIe interface. On the other hand, if needed, storage media can be separated and used. It is possible to provide a power extension board configured to accommodate a power supply module having a changed length in preparation for a change in the power supply module in the future. In addition, it is possible to solve a problem in that a space inside a case is not utilized when only an extension system is implemented in a rear part of a rack mount case. Furthermore, it is possible to implement a development object, i.e., an extension system in a rear part of a rack mount case storage system and also dispose a separate PCIe x16 interface card outward. It is possible to provide one or more redundant array of independent disk (RAID) cards configured to drive internal storage media in an interior space of the rear part and also provide a method in which the RAID cards are connected to four PCIe x4 from the PCIe x16 interface card, thereby expecting to solve a problem in that an interior space of a case of a conventional storage system is not utilized.

The effects of the present invention are not limited to the effects mentioned above, and other effects can be clearly understood from the description of the claims by those skilled in the art.

BEST MODE OF THE INVENTION

Figure 1:
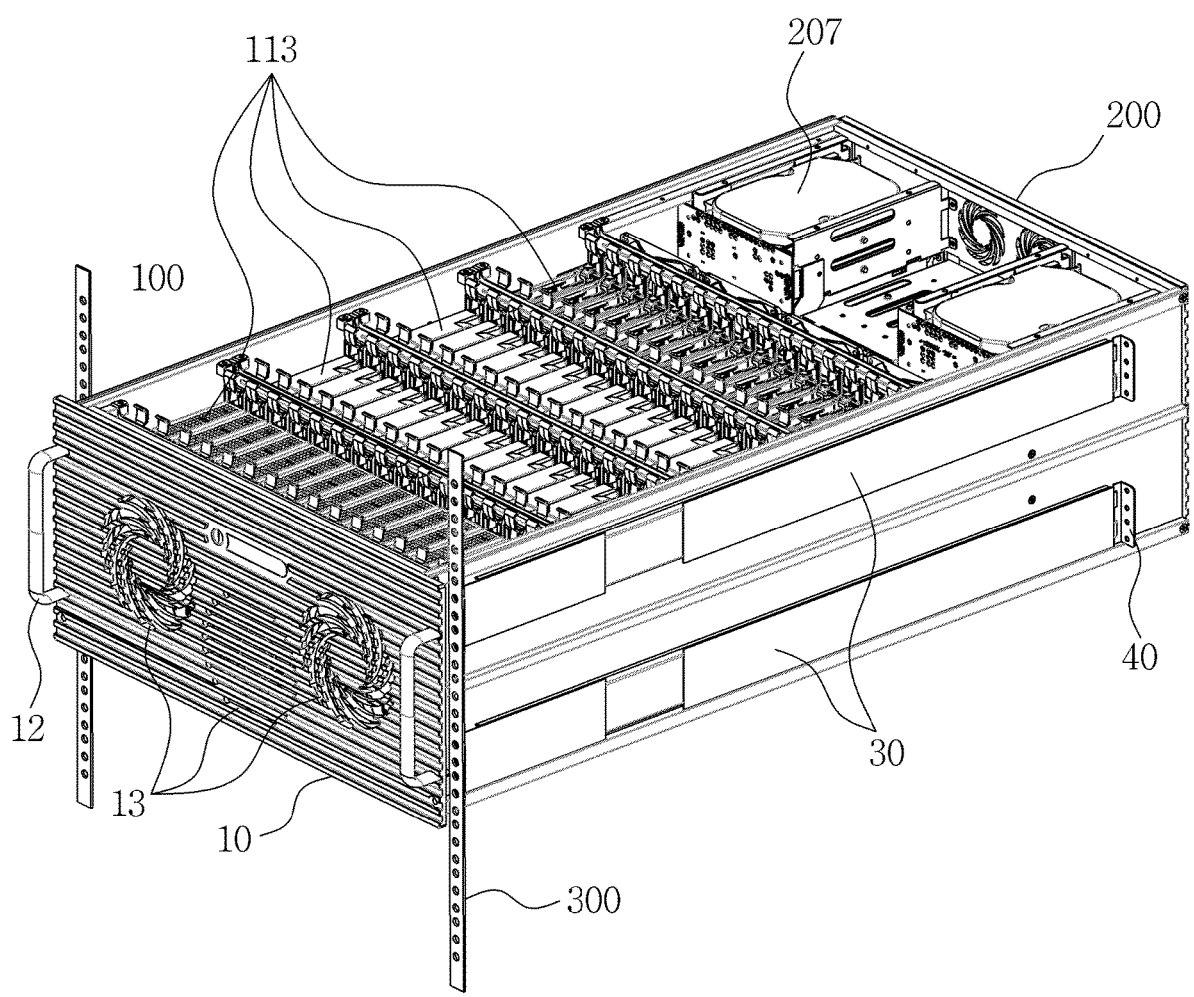
FIG. 1 is a perspective view illustrating a rack mount case storage system having a detachable body when viewed from a side thereof according to an embodiment of the present invention.

Advantages and features of the present invention, and implementation methods thereof will be clarified through the following embodiments described with reference to the accompanying drawings. Embodiments of the technical spirit of the present invention may, however, be embodied in various forms and should not be construed as limited to the embodiments set forth herein. Rather, these embodiments are provided so that this disclosure is thorough and complete, and will fully convey the scope of the present invention to those skilled in the art. Also, embodiments of the technical spirit of the present invention are just defined only by the appended claims.

The terms used herein describe embodiments but will not limit the present invention. As used herein, singular expressions, unless defined otherwise in contexts, include plural expressions.

It will be further understood that the terms "comprises," "comprising," "includes," "including", "has," and/or "having" when used in this specification, specify the presence of stated features, numbers, steps, operations, elements, components, and/or combinations thereof, but do not preclude the presence or addition of one or more other features, numbers, steps, operations, elements, components, and/or combinations thereof.

The embodiments described in the present specification will be described with reference to cross-sectional views and/or plan views which are ideal exemplary views of the present invention. In the drawings, the thicknesses of layers and regions are exaggerated for effective illustrations of the technical concept. Therefore, a form of the drawings by production technology and/or an allowable error may be changed. Therefore, the embodiments of the present invention are not limited to the shown specific forms, but may include changes in form that are created or needed during the manufacturing process. For example, a region illustrated as a rectangle may be rounded or have a predetermined curvature. Therefore, the regions illustrated in the drawings have schematic properties, and the shapes of the regions illustrated in the drawings are illustrative of specific shapes of regions of a device and are not intended to limit the scope of the present invention.

Like reference numerals refer to like elements throughout. Therefore, even if the same or like reference numerals are not referred or described in a related drawing, they may be described with reference to another drawing. Further, even if an element is not assigned a reference numeral in a drawing, this element may be described with reference to other drawings.

Embodiments of the present invention will be described with reference to the accompanying drawings.

Figure 2:
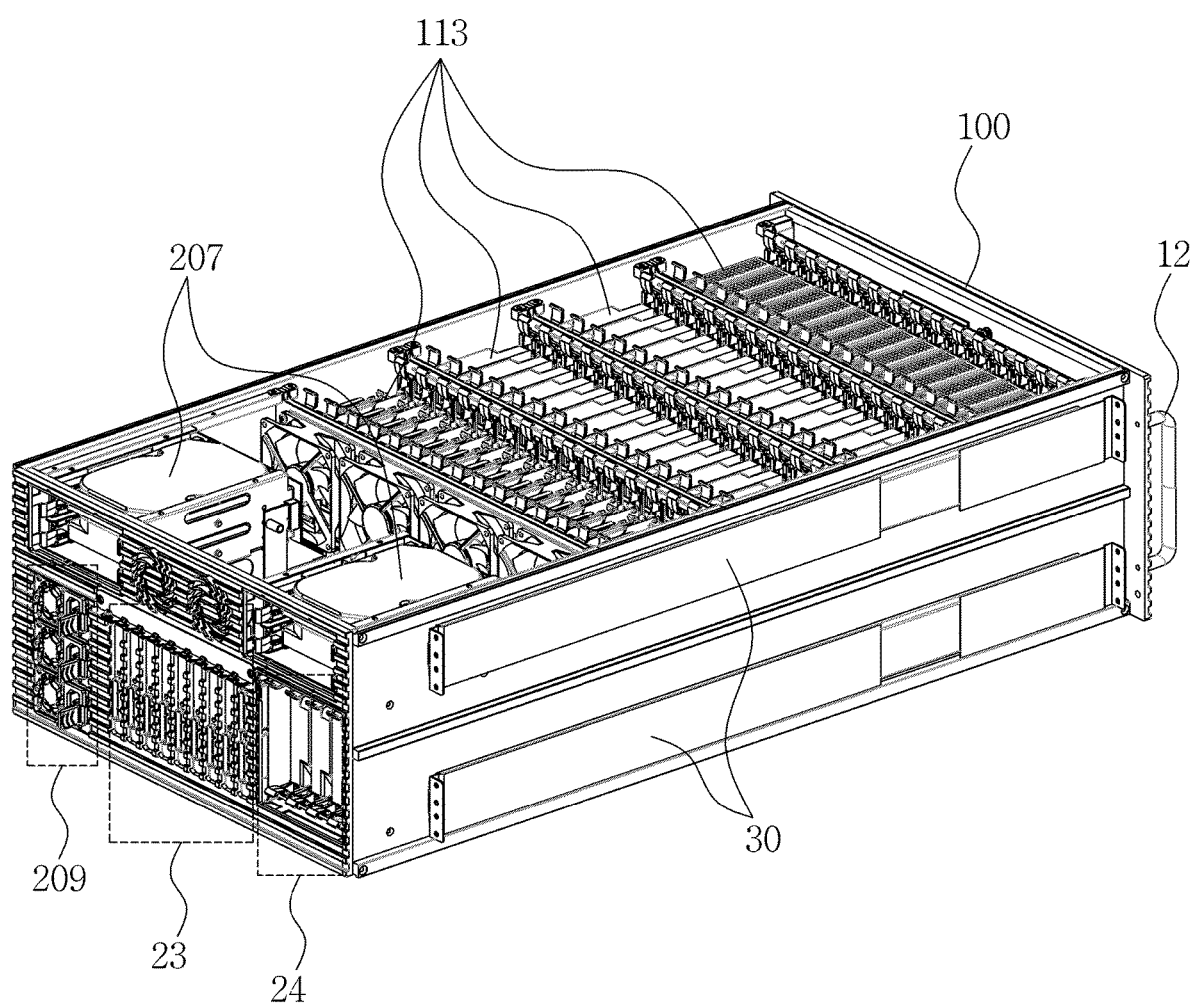
FIG. 2 is a perspective view illustrating the rack mount case storage system having the detachable body when viewed from a rear thereof according to the embodiment of the present invention.
Figure 3:
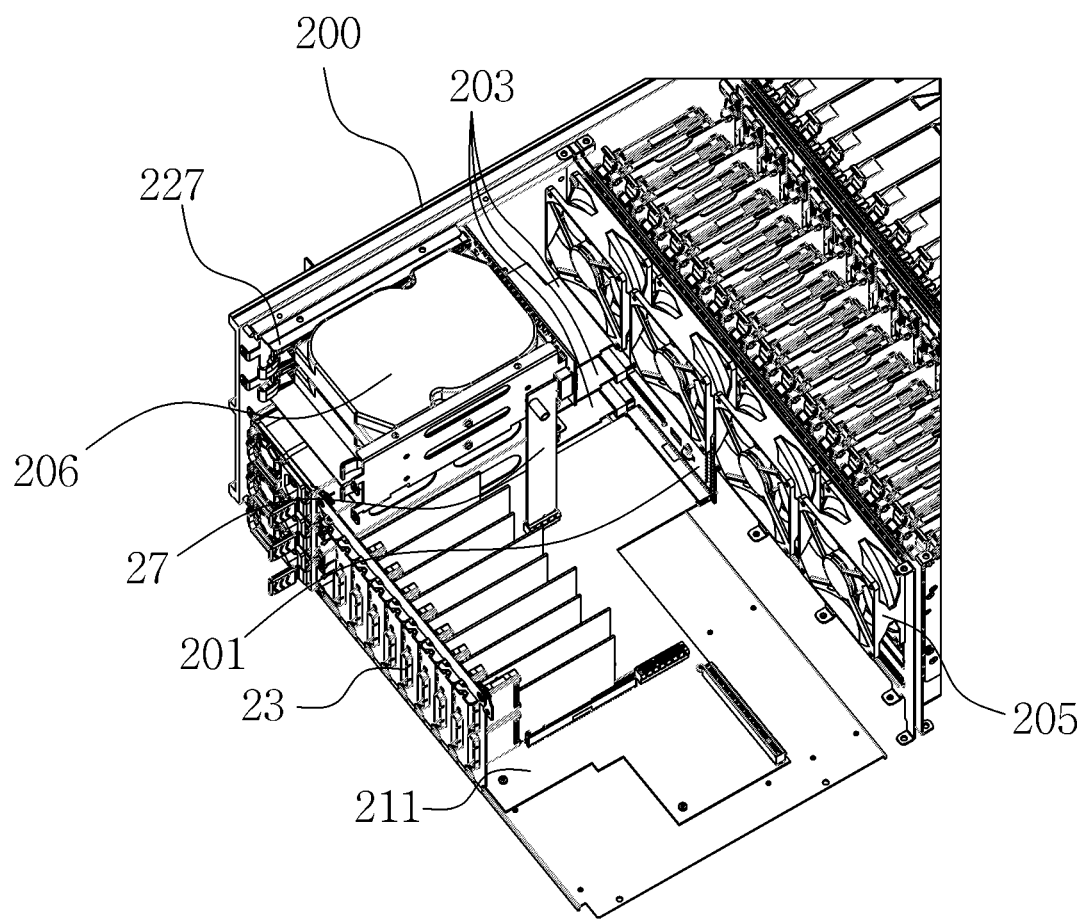
FIG. 3 is an internal structural view illustrating a rear case according to an embodiment of the present invention.

FIG. 1 is a perspective view illustrating a rack mount case storage system having a detachable body when viewed from a side thereof according to an embodiment of the present invention. FIG. 2 is a perspective view illustrating the rack mount case storage system having the detachable body when viewed from a rear thereof according to the embodiment of the present invention. FIG. 3 is an internal structural view illustrating a rear case according to an embodiment of the present invention.

Figure 4:
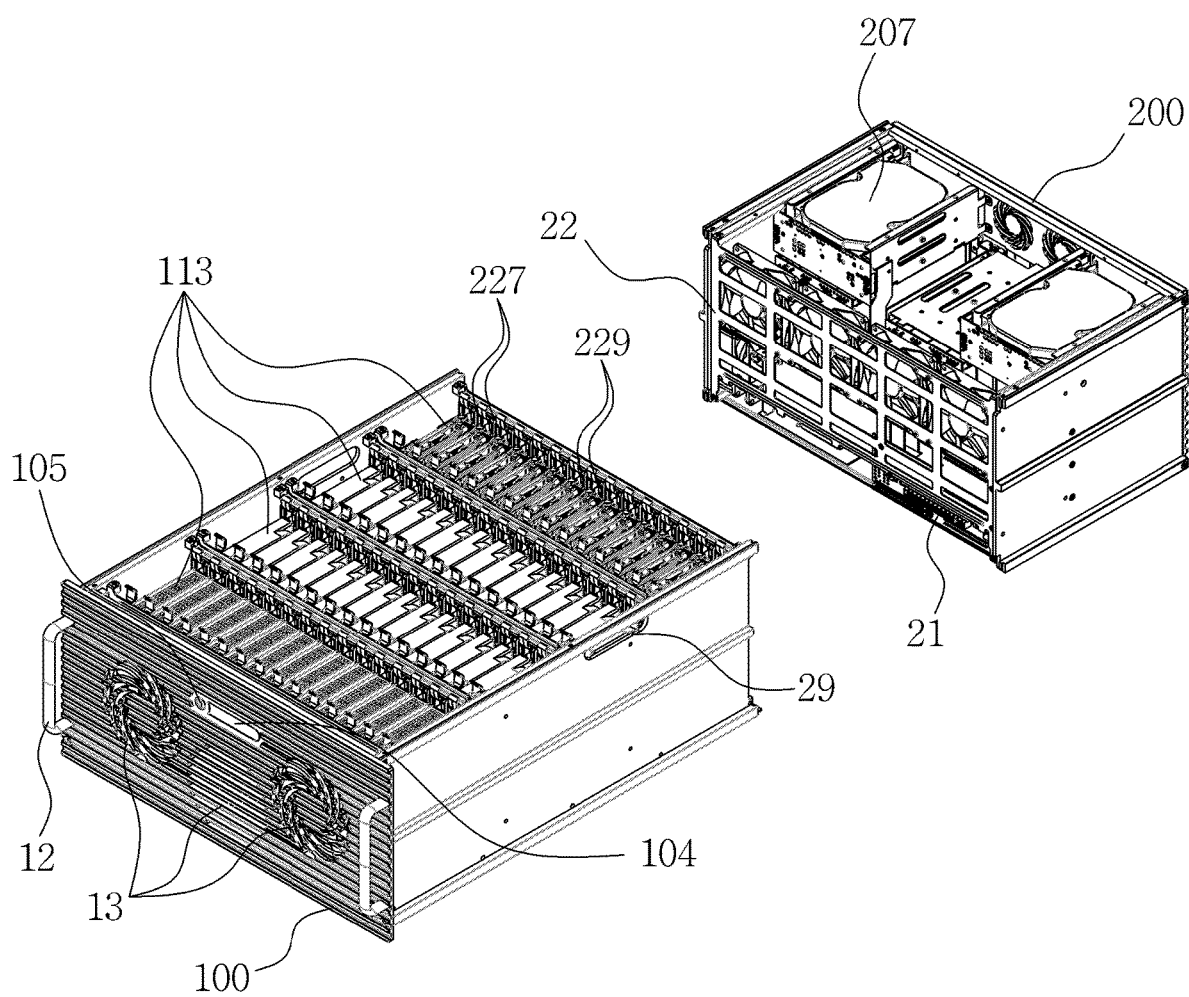
FIG. 4 is a structural view illustrating a state in which a front case and the rear case are detached according to an embodiment of the present invention.
Figure 5:
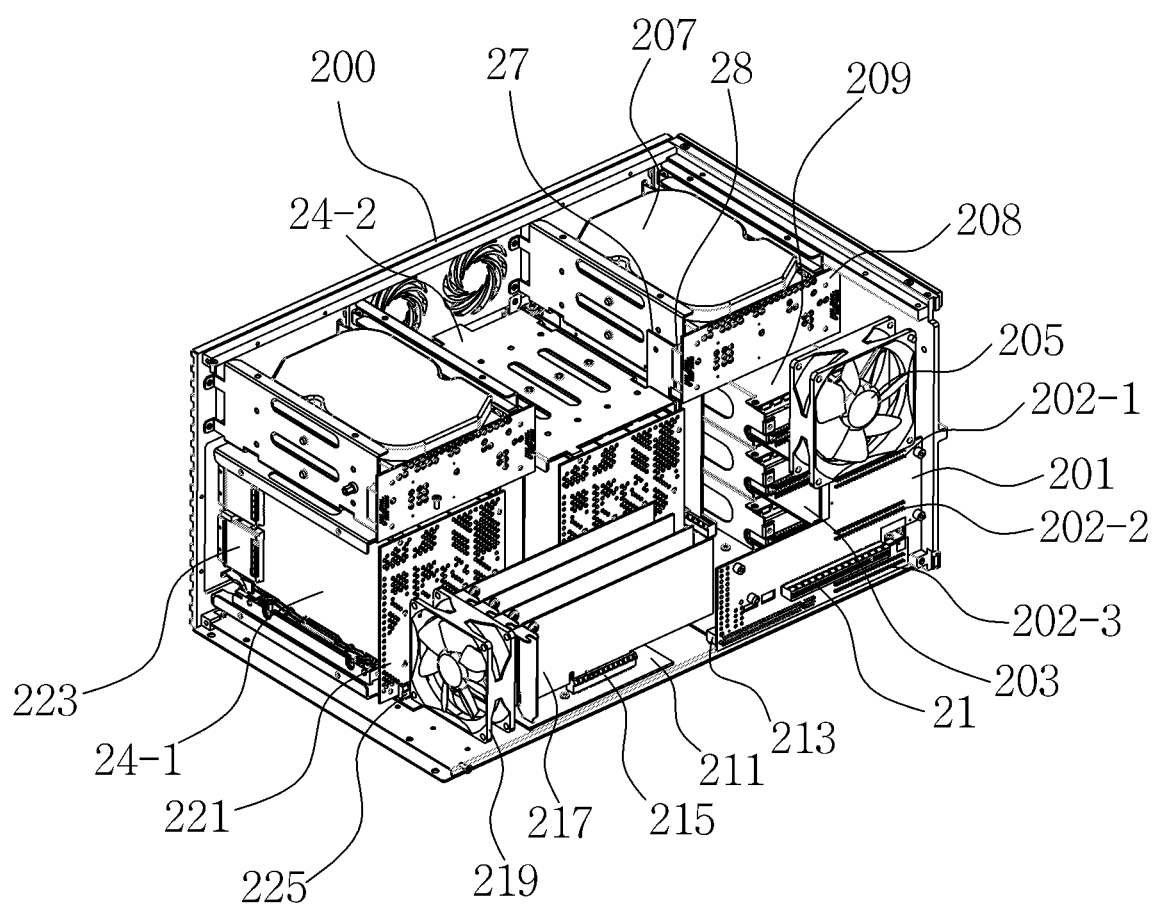
FIG. 5 is an enlarged perspective view illustrating the rear case according to an embodiment of the present invention.
Figure 6:
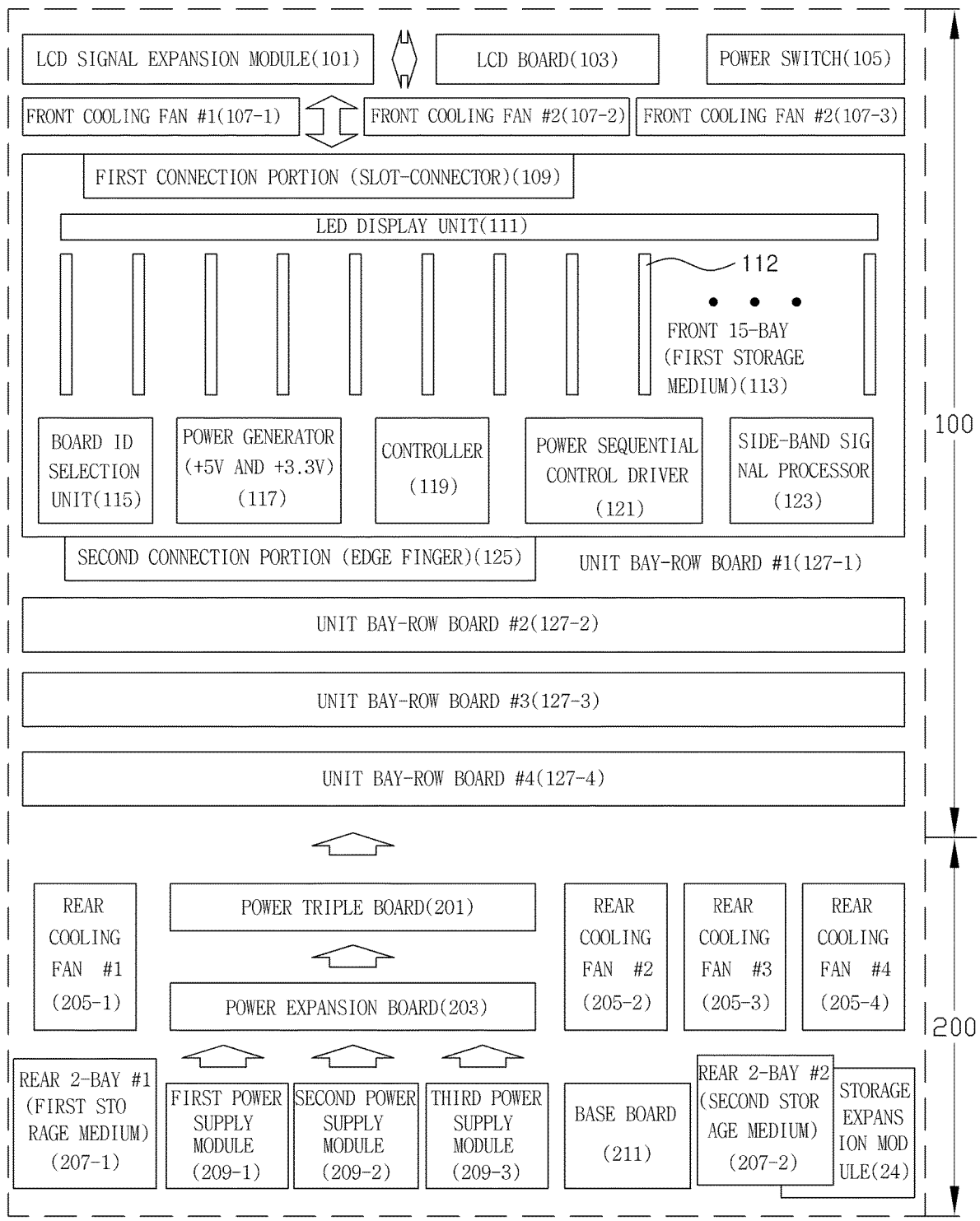
FIG. 6 is a schematic block diagram illustrating electronic components mounted on the rack mount case storage system having the detachable body according to an embodiment of the present invention.

FIG. 4 is a structural view illustrating a state in which a front case and the rear case are detached according to an embodiment of the present invention. FIG. 5 is an enlarged perspective view illustrating the rear case according to an embodiment of the present invention. FIG. 6 is a schematic block diagram illustrating electronic components mounted on the rack mount case storage system having the detachable body according to an embodiment of the present invention.

Figure 7:
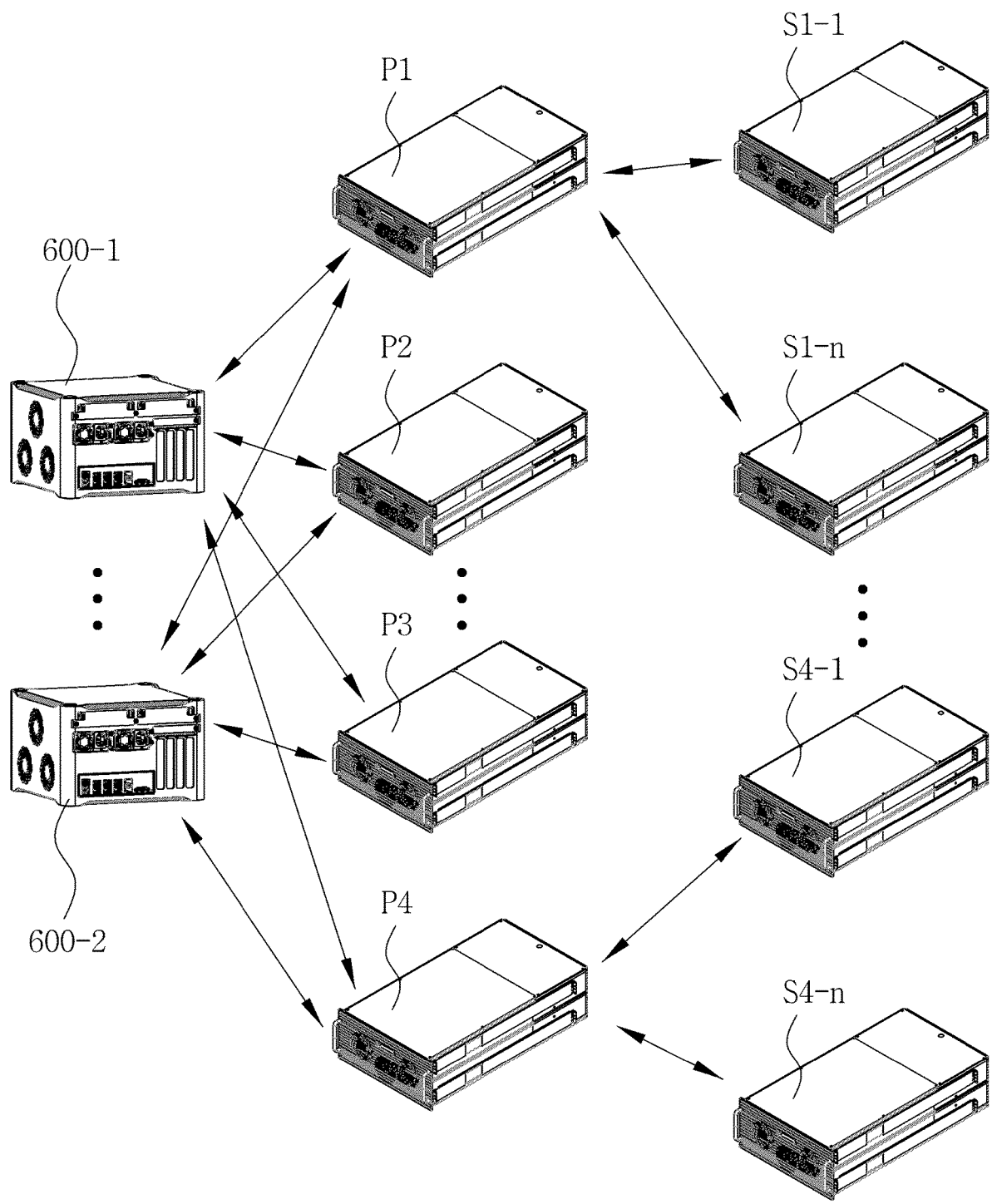
FIG. 7 is a view illustrating a state in which a storage extension system is constructed in a server when the rack mount case storage system having the detachable body, which includes the front case and the rear case constituting a detachable structure, is applied according to an embodiment of the present invention.
Figure 8:
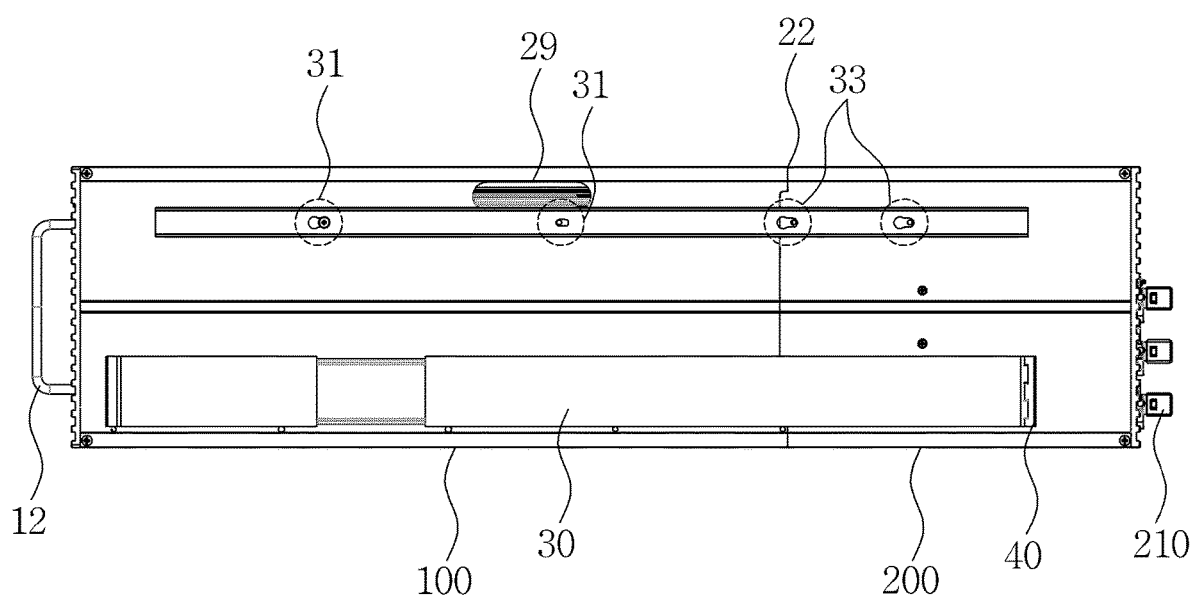
FIG. 8 is a schematic side view illustrating a coupling relationship between the front case and the rear case constituting the rack mount case storage system having the detachable body according to an embodiment of the present invention.

FIG. 7 is a view illustrating a state in which a storage extension system is constructed in a server when the rack mount case storage system having the detachable body, which includes the front case and the rear case constituting a detachable structure, is applied according to an embodiment of the present invention. FIG. 8 is a schematic side view illustrating a coupling relationship between the front case and the rear case constituting the rack mount case storage system having the detachable body according to an embodiment of the present invention.

Figure 9:
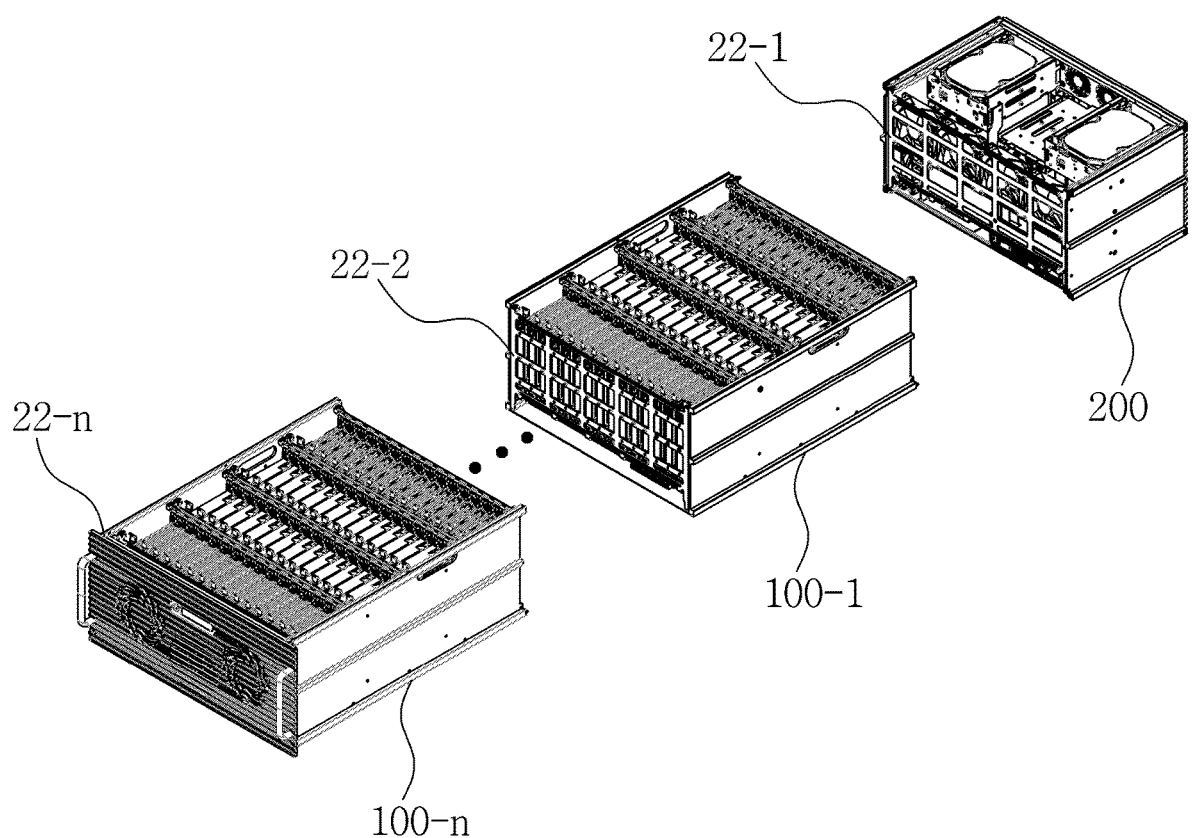
FIG. 9 is a view illustrating a coupling configuration of a front case and a rear case formed in a multi-stage according to an embodiment of the present invention.

FIG. 9 is a view illustrating a coupling configuration of front cases formed in a multi-stage according to an embodiment of the present invention.

Referring to FIGS. 1 to 9, the rack mount case storage system having the detachable body according to the embodiment of the present invention includes a front case 100 and a rear case 200, which are couplable or detachable.

The front case 100 includes a first storage medium 113, wherein modules (hereinafter, bay-row boards 127) constitute a four-stage arrangement structure such that 3.5-inch sized storage media are arranged at certain intervals to form 15 bays. The bay-row board 127 includes a first connection portion 109 which is a connector type and includes a power line and an interface signal line so as to be connected to adjacent another bay-row board in an electro circuit manner and a second connection portion 125 which is a form of an edge finger and corresponds to the first connection portion 109 at a position opposite to the first connection portion 109.

The rear case 200 has a shape in which two-bay modules for a 3.5-inch storage medium are disposed at left and right upper ends of the rear part and which accommodates a second storage medium 207 and a power supply module 209. The rear case 200 allows the second connection portion 125 and the first connection portion 109 to be connected to each other such that power is supplied to the front case 110 through the second connection portion 125 provided in the front case 100 connected to a third connection portion provided on a power triple board 201 which receives power from the power supply module 209.

In this case, slide rail portions 30 disposed in a three-stage, which are mounted and coupled to rail grooves of a rack structure, are formed at both side surfaces of the front case 100 and the rear case 200. In addition, fixing supports 40 in a form of a slide rail are formed at both ends of the rail portions 30 so as to be coupled to rack supports 300 through coupling portions when the front case 100 and the rear case 200 are separated or concurrently mounted on the rack structure by the rail portions 30.

A plurality of front grips 12 and a plurality of fan grilles 13 corresponding to a plurality of front cooling fans 107 provided inside the front case 100 are formed on one surface of the front case 100. A boundary portion 22 having a lattice structure is formed on one surface of the rear case 200. A plurality of rear cooling fans 205 are coupled and fixed to the boundary portion 22.

An edge finger portion (not shown) of each unit power supply module constituting the power supply module 209 is directly insertion-connected to a power supply module connection connector 202 on the power triple board 201 provided at the boundary portion 22 of the rear case 200. As a result, an advanced technology extended (ATX) power cable harness required for a power connection is removed, thereby simplifying an internal wiring and improving an air flow.

Here, a separate power extension board 203 may be provided between the power supply module 209 and the power triple board 201, and thus power supply module 209 may also be connected to the power triple board 201 through the separate power extension board 203.

In addition, a base board 211 is connected through a fourth connection portion 213 for power and signal connections provided at a lower end of the power triple board 201.

The power triple board 201 supports hot swap mounting and removing with respect to each of unit power supply modules 209-1, 209-2, and 209-3. A status display light-emitting diode (LED) (not shown) is connected to a power supply module exposure portion protruding to the outside from the power triple board 201 to display an error message to a front panel liquid crystal display (LCD) 104 when a power failure occurs.

On the other hand, the base board 211 further includes a vertical connection board 27 connected to the second storage medium 207. The second storage medium 207 receives power necessary for an operation from the base board 211 through the vertical connection board 27 and is configured such that a fault LED signal with respect to a $16^{th}$ storage medium, which is output from each of bay-row boards 127-1, 127-2, and 127-3, and 127-4, passes through the first connection portion 109, the second connection portion 125, and the base board 211 of the power triple board 201 corresponding to the third connection portion 21 and is supplied to an LED (not shown) on a backplane board 208 provided in the second storage medium 207.

A peripheral component interconnect express (PCIe) slot portion 23 is an extension card interface slot to which a PCIe interface card based on a PCIe slot, a redundant array of independent disk (RAID) card, and a storage extension module based on a PCIe slot are connected.

As described above, the rack mount case storage system 1 having the detachable body according to the embodiment of the present invention is mounted on a standard rack used in a data center or the like and is also mounted in a standard rack which generally comes into wide use. This will be described in more detail with reference to the accompanying FIGS. 1 to 6.

First, in consideration of stability and reliability of a system, the cooling fans 107 and 205 are mounted on front and rear surfaces so as to be operated in a push-pull manner. On the basis of temperature information data measured by taking full advantage of low heat characteristics due to a motherboard not being mounted unlike a conventional storage system, rotation speeds of the cooling fans 107 and 205 are adjusted to implement a low noise storage system.

However, it is necessary to perform a design on heat generating components such that a RAID card 217 such that an air flow is supplemented. A hybrid storage system, which is capable of using a hard disk drive (HDD) positioned as a main storage medium and a 3.5-inch type solid state drive (SSD)-based storage medium (SSD doubler, SSD tripler, or M2 multiplier) in addition to the HDD, is to be implemented in the first storage medium 113 and the second storage medium 207.

In addition, it is possible to implement performance of PCIe x4, x8, or x16 Gen.3 based on an optical interface as high performance interface for high capacity. Furthermore, a storage extension module may be fused and integrated in a signal storage system.

Here, a PCIe x16 interface is used for an interface purpose of a storage system directly connected to host computers 600A and 600B. A PCIe x4 interface is used for an extension purpose through the storage extension module 24. A PCIe x8 interface is used for an extension interface purpose in which the number of storage systems extending through the storage extension module 24 is relatively small and high performance is required.

Meanwhile, when the rack mount case storage system having the detachable body according to the embodiment of the present invention is applied, due to a motherboard for a server and various components mounted thereon being removed from an inner side of the storage system, fundamental heat generating sources may be removed. Concurrently, a physical space, which is secured through a reduction in capacity and reduction in weight, thickness, and size of the power supply module due to the removal of a maximum power consuming component, i.e., the motherboard, may be extended to mounting spaces of the first storage medium 113 and the second storage medium 207, thereby operating the front cooling fan 107 and the rear cooling fan 205 at a relatively low rotation speed to reduce noise and considerably increase a replacement life cycle of the cooling fans 107 and 205.

In addition, unlike a conventional storage system, since the power triple board 201 is directly designed and applied to be suitable for an architecture and a special arrangement structure of the modified storage system, the ATX power cable harness may be removed, thereby simplifying an internal wiring and improving an air flow. In addition, the power supply module 209 may have a structure in which three unit power modules are accommodated such that the storage system has higher stability as an enterprise storage system. A power supply unit (PSU) extension board 203, which connects a PSU edge finger of a power output terminal of each power supply module 209-1, 209-2, or 209-3 to the power triple board 201, may be provided in each power supply module. Meanwhile, the power triple board 201 may support hot swap mounting and removing with respect to each unit power supply module. The status display LED may be provided in the power supply module exposure portion protruding to the outside from the power triple board 201 to display an error message to the LCD 104 when a power failure occurs.

On the other hand, in order to constitute a 16-bay, two 3.5-inch 2-bay configuration module 207 may be provided in the rear case 200 so as to correspond to the bay-row boards 127-1, 127-2, 127-3, and 127-4. In the base board 211, the backplane board 208 of the 3.5-inch 2-bay module 207 may be connected to the base board 211 through the vertical connection board 27. In addition, power required for an operation may be supplied from the base board 211 through the vertical connection board 27. A fault LED signal with respect to the 16$^{th}$ storage medium, which is output from each of the bay-row boards 127-1, 127-2, and 127-3, and 127-4, may pass through the power triple board 201 and the base board 211 1 and may be supplied to the LED (not shown) on the backplane board 208 provided in the 2-bay medium 207.

Meanwhile, an LED light guide plate 227 may be mounted on the rack mount case storage system having the detachable body according to the embodiment of the present invention. Two LED light guide plates 227 coupled to outer hard guides 229 may be provided in a unit bay including the bay-row board 127, into which all 3.5-inch storage media are inserted. One LED light guide plate 227 may be for an activity LED display, and the other LED light guide plate 227 may be for a fault LED display. The other LED light guide plate 227 may protrude to the outside to guide a user to recognize an operation state and replace a storage medium at a precise position at which an error occurs.

[Modes of the Invention]

A circuit connection state of electronic components mounted on the rack mount case storage system having the detachable body according to the embodiment of the present invention will be described.

First, circuit units for each functional element according to the order from the front case 100 to the rear case 200 will be described. An LCD board used in a 64-bay storage system displays various pieces of status information (for example, temperature, an error of front/rear cooling fans, an error for each power module, and an error position for each bay of a storage medium) in the storage system of the present invention through the LCD 104 exposed to the outside.

Signals input to and output from the LCD board go through a signal transmission flow according to the order of the base board 211, the power triple board 201, the bay-row boards 127-4, 127-3, 172-2, and 127-1 corresponding to the third connection portion, an LCD extension board 101, and the LCD board 103 and thus transmit important information of each board.

A power switch 105 performs an on/off operation on each of the power supply modules 209-1, 209-2, and 209-3 so that a power-on signal is transmitted to the power triple board 201 by an inner protrusion of an injection molded structure pushing a tact switch (not shown) provided at a left side of a power switch board and a controller (not shown) of the power triple board 201 discriminates the signal.

A circuit is provided in the LCD signal extension board 101 provided inside the front case 100 to drive three cooling fans 107-1, 107-2 and 107-3. A counterpart connector of the cooling fan is connected to each fan connector, and a connector for a connection to the power switch 105 is provided at a right end. This is for a connection configuration using a separate cable. Therefore, three cables may be used only in the LCD signal extension board 101 in the storage 1 of the present invention so that the LCD board 103, and thus, the cooling fan 107, and the power switch 105 may be connected.

[Bay-Row Board (Main Backplane Board) 127]

In the storage system 1 of the present invention, as a board which is mounted with most storage media and forms an electro circuit connection relationship, the unit bay-row board 127 constitutes a 15-bay and includes the first connection portion 109 including a saddle type card-edge connector for PCIe x16 and the second connection portion 125 including a PCIe x16 edge finger portion, which are disposed at a top end and a bottom end thereof. The first connection portion 109 and the second connection portion 125 connect various powers and control signals to adjacent boards.

[Unit Bay Configuration Unit]

A unit bay configuration unit includes an SFF-8639 connector to which a 3.5-inch storage medium is coupled, a PCIe/serial AT attachment (SATA) demultiplexer (DEMUX) integrated circuit (IC) (not shown) for a hybrid storage configuration, and a SATA 7-pin connector (not shown). 15 horizontal arrangements are formed, and the SATA 7-pin connector is connected using the RAID card 127 and an SFF-8643 cable (not shown) provided on the base board 211.

[+12 V Generator]

Two output voltages of +12 V(1) and +12 V(2) are generated from source powers of +12 V-A, +12 V-B, and +12 V-C output from power source modules connected between the saddle type card-edge connector for PCIe x16 and the PCIe x16 edge finger portion.

A difference between times at which the +12 V(1) and the +12 V(2) are generated by a time difference control of a controller 119 including a built-in 8-bit main controller (MCU) is about 500 milliseconds (ms). It is to drive an entire HDD using a single PSU having low capacity by dispersing an abrupt starting current with a time difference when a specific storage media includes a 3.5-inch HDD.

Similarly to the above, each of the bay-row boards 127-1, 127-2, 127-3, and 127-4 includes a board identification (ID) selection unit 115 including a dual in-line package (DIP) switch (not shown) for internally receiving different IDs. All the bay-row boards (not shown) are sequentially operated not only internally but also externally with a time difference of 500 ms according to setting states of the DIP switches set to be different from each other.

In this case, a voltage of +5 V is generated into powers of +5 V(1) and +5 V(2) using the voltage of +12 V(1) and the voltage of +12 V(2) as source voltages. The power of +5 V(1) is applied to +5 V terminals of eight SFF-8639 connectors at a right side, and the power of +5 V(2) is applied to +5 V terminals of seven SFF-8639 connectors at a left side. A side-band signal processor 123 including a complex programmable logic device (CPLD) independently receives serial general purpose input/output (SGPIO) signals output from a side-band cable (not shown) of the RAID card 217 as four independent groups and concurrently performs decoding processing to output activity LED signals and fault LED signals with respect to storage media connected to each unit bay configuration unit. The output activity LED signals and fault LED signals are supplied to LEDs arranged at certain intervals at a lower end of the bay-row board.

[PCIe Clock Signal Generator]

When a PCIe interface storage medium is connected to each SFF-8639 connector 112, to which a storage medium introduced through a unit bay is connected, in order for the SFF-8639 connector 112 to be normally operated, a PCIe reference clock signal should be input. To the end, five PCIe reference clock generator may be used.

[Power Triple Board 201]

Connectors 202-1, 202-2, and 202-3 connected to three external separate power supply modules 209 are provided at left upper, middle, and lower ends. Power is supplied to the base board using source power of +12 V input from each power supply module 209, or the source power of +12 V is supplied as source powers of +5 V and +3.3 V power generators. Powers of +5 standby voltages (VSB) and +3.3 VSB are generated at a left end, and are supplied to the base board 211, the bay-row board 127, and the LCD signal extension board 101 through the third connection portion 21 at a central lower end of the power triple board 201.

[ATX Power Connector]

Powers of +12 V, +5 V, +3.3 V, and +5 VSB generated in the power triple board 201 are supplied to corresponding pins of an ATX power connector (not shown) provided at a right end and are used for the purpose of supplying power to a motherboard when an ATX motherboard is installed at a position of the base board 211 later. Powers of +12 V, +5 V, +3.3 V, and +3.3 VSB are also supplied to the base board 211 so that it is not necessary to implement a circuit for generating separate power in the base board 211.

[Power Extension Board 203]

The power extension board 203 is used to extend output power and a control signal of the edge finger portion (not shown) of the power supply module 209 between the power supply module 209 and the power triple board 201. In a case in which a currently used power supply module is replaced with a third party product or a capacity increase is attempted, when a length of a power supply module is changed, a space between the power module 209 and the power triple board 201 is secured, only a length of the power extension board may be adjusted. Thus, a length of a rack mount case may not be adjusted.

A fixing hole (not shown) in a lower end is fixed using a sidewall bolt constituting the rack mount case storage system having the detachable body, thereby solving a phenomenon in which the power extension board is disconnected from the power triple board 201 by being pulled by the power supply module when the power supply module is mounted and detached.

[Base Board 211]

The base board 211 includes a series of PCIe slot connectors in which the PCIe interface card 23 and a RAID card 217 connected to the host computer 600 are mounted. The base board 211 receives various operation powers from the power triple board 201. The vertical 4-bay extension module 24 provided with eight nodes based on PCIe x4 is provided in a space between a slot (not shown) for a storage extension interface card 223 and a connector 225 for the storage extension module 24. A wiring is formed to linearly connect a slot for the storage extension interface card 223 and the connector 225 for the storage extension module 24.

[PCIe Clock Generator]

A PCIe clock generator supplied four clock signals branched using a reference clock input from the host computer 600 through a PCIe slot at a left upper end thereof to the power triple board 201, the fourth connection portion 213 for a connection to the base board 211, the left and right vertical connection boards 27, and a PCIe reference for a RAID card.

An MCU (not shown) receives the following pieces of status information output from four side-band slots for a PCIe x8 interface. The MCU receives connection status information with the host computer 600, i.e., connection status information on whether a connection relationship is formed through one PCIe interface of PCIe x16, x8, and x4 or is not formed at all. In addition, the MCU receives connection status information with the storage system (RAID card), i.e., status information on whether a connection relationship with a RAID card provided in adjacent slot is formed through PCIe x16, x8, or x4 or is not formed at all. Furthermore, the MCU receives preset temperature limit arrival information of a temperature detection sensor (not shown), i.e., preset temperature limit arrival information output from the temperature detection sensor (not shown) provided in each PCIe interface card 23.

The MCU (not shown) outputs various pieces of status information to a controller (not shown) on the LCD board 103, wherein the various pieces of status information are connected by sensing output states of four IF_CARD_ID # [3:0] signals and three BAY_ROW_BD_ID # [2:0] signals output from the controller (not shown) provided on the LCD board 103 inside a front panel.

[Vertical Connection Board 27]

The vertical connection board 27 receives powers of +12 V, +5 V, +3.3 V, and +3.3 VSB from the base board 211 as powers used in 3.5-inch 2-bay modules 207-1 and 207-2 provided at left and right upper ends of the rear part. The powers of +12 V, +5 V, and +3.3 VSB are supplied to the SFF-8639 connector (not shown) and are supplied to the storage extension interface card 223, and the power of +3.3 V is used as a driving voltage of an internal logic element of the 3.5-inch 2-bay module 207.

A fault LED signal for a $16^{th}$ bay generated through a side-band signal processing operation by the side-band signal processor 123 in the bay-row board 127 and a reference clock signal for a PCIe interface generated in the base board 211 are transmitted to the backplane board 208 of the 3.5-inch 2-bay module 207 through an edge finger portion at a lower end. Whether there is an error of a corresponding medium may be confirmed outside the module through the LED and the LED light guide plate 227 provided on the backplane board 208.

In the rack mount case storage system having the detachable body according to the embodiment of the present invention, the vertical connection board 27 applied to a base product of the 64-bay storage system 1 is designed into two different shapes. The vertical connection board 27 is used to connect the base board 211 and the backplane board 208 of the 2-bay module 207 disposed at an upper end of the storage extension module in the rear part and includes an edge finger which is inserted into a key rear portion of a PCIe x4 slot connector used for a side-band signal of a PCIe x16 slot (not shown) for an interface of the storage extension module 24. The vertical connection board 27 is used to connect the base board 211 and the backplane board 208 of the 3.5-inch 2-bay module 207 disposed at an upper end of the power supply module in the rear part. To this end, a PCIe x1 slot connector provided on the base board.

[Backplane Board 208 for 3.5-inch 2-Bay]

The backplane board 208 for a 3.5-inch 2-bay is a common backplane board 208 for the 3.5-inch 2-bay modules 207 provided at the left and right upper ends of the rear part of the 64-bay storage 1. Connectors 28 for a vertical connection board are provided at left and right sides of the backplane board 208 for common use of the backplane board 208.

In particular, the backplane board 208 is vertically disposed in a two-stage at a center of the SFF-8639 connector (not shown) to which an SSD storage medium (SSD tripler or M2 multiplier) based on a PCIe interface is coupled or a 3.5-inch HDD is coupled. The backplane board 208 is provided with a reference clock distribution circuit for a PCIe interface, and thus, a clock signal output from the reference clock distribution circuit is input to the SFF-8639 connector (not shown).

[4-Bay Backplane Board 221 for Storage Extension Module]

A 4-bay backplane board 221 for the storage extension module 24 may include four 3.5-inch bays and thus include a 3.5-inch HDD, a storage medium (SSD tripler or M2 multiplier) operated based on a PCIe interface, or a storage extension card 223 operated based on a PCIe x4 (Gen.3, 32 Gbps) interface. Each of four SFF-8639 connectors (not shown) of the unit configuration unit is connected to the PCIe x16 edge finger portion at the lower end through a PCIe x4 interface. A clock distribution circuit is provided at an upper end to supply a PCIe reference clock to each SFF-8639 connector.

Meanwhile, the rack mount case storage system having the detachable body according to the embodiment of the present invention has technical characteristics in which a concept of a storage extension module is introduced to provide four 3.5-inch bays in a basic model, and while 16 nodes are supported in a single node-based PCIe x4 (Gen.3, 32 Gbps), a 64-bay storage space is used as it is.

In this case, the unit module 24 for a storage extension may include a 3.5-inch 4-bay. Two nodes of the PCIe x4 (Gen.3, 32 Gbps) may be exposed to the outside in each bay, and two extension modules may be mounted to support an extension port having a total of 16 nodes.

[Storage Extension Card 223]

Four storage extension cards 223 are mounted for each unit storage extension module 24 and include an SFF-8639 plug corresponding to the backplane board and two connectors for a PCIe x4 optical cable. A peripheral component interconnect (PCI) express switch is disposed between the SFF-8639 plug and the two connectors for the PCIe x4 optical cable and forms a second PCIe HUB which branches a PCIe x4 (Gen.3, 32 Gbps) interface signal supplied to SFF-8639 into two PCIe x4 signals.

The two connectors for the PCIe x4 optical cable may each be operated as an independent PCIe x4 according to a method of configuring a circuit. The connectors may be physically separated, but may be operated as one PCIe x8.

Therefore, when a storage system required for an extension requires faster data transmission, the connectors may be connected through PCIe x8 using two PCIe optical cables having the same length to be operated.

[Backplane Board 221 for Storage Extension Module]

Each storage extension module 24 is combined with a PCIe x16 (Gen.3, 128 Gbps) interface card (not shown) connected to the host computer 600 through an optical cable. The PCIe x16 interface card is connected to the PCIe x16 slot 225 at an inner lower end in a linear wiring structure, wherein the backplane board 221 of the storage extension module 24 is connected to the PCIe x16 slot 225. Each wiring is branched by PCIe x4 signals of four groups from the PCIe x16 interface card and is connected to each SFF-8639 connector (not shown) provided on the backplane board 221.

Here, the RAID card 217 for driving a 64-bay storage medium provided in a rack mount case is mounted in a separate space formed inside thereof.

[Mounting Structure of Internal RAID Card 217]

Four RAID cards 217 for storage media on the four bay-row boards 127 are arranged in a series in a horizontal direction on a rear surface of the backplane board 221 of the storage extension module. Taking into consideration that an SFF-8643 cable port provided in the RAID card 217 is disposed at an upper side or a rear side of the RAID card, a 80-mm cooling fan 219 for cooling the RAID card is disposed on a front surface of a PCIe bracket of the RAID card 217 and is fixed by using a hexagonal mounter (standoff) provided on adjacent sidewall.

[Base Board 211]

The base board 211 is for the storage extension system 24, includes two protrusions at a lower end thereof, and includes PCIe x8 slots 215 for four RAID cards 217.

Each RAID card 217 is connected to each of PCIe interface signals of four groups branched in PCIe x4 from a slot for the PCIe x16 interface card connected to the host computer 600 provided on a right upper end.

A combination of two PCIe x16 slot connectors for the storage extension module 24 is disposed at each of a left side and a center of an upper end so as to correspond to a first storage extension module 24-1 and a second storage extension module 24-2. A controller (not shown) receives sideband signals of three PCIe x16 interface cards disposed at the upper end, monitors various pieces of status information such as PCI express interface connection information and temperature information on the host computer 600 and the storage system (RAID card) with respect to each interface card, and transmits related information to the LCD board 103 disposed on a rear surface of the front part.

Therefore, when the rack mount case storage system having the detachable body 1 according to the embodiment of the present invention is applied, as shown in the accompanying FIG. 7, the rack mount case storage system may be extended in such a manner that four primary storages P1, P2, P3, and P4 and 56 secondary storages S1 to S1-*n* and S4-1 to S4-*n* are connected to two servers 600-1 and 600-2.

[Server]

A dual-host failover function is a function in which, while a storage system is operated by the server 600-1 functioning as a master, when a master server fails and the storage system is not accessed, without separate system booting, the server 600-2 operated in a standby state takes over as a function of the master server immediately when the master server fails, thereby normally performing access to the storage system.

Assuming that four PCIe x16 (Gen.3, 128 Gbps) slots available for one server 600 are provided, the 64-bay storage system 1 of the present subject including two storage extension modules 24-1 and 24-2 is connected to one PCIe x16 interface slot, and a PCIe x16 (Gen.3, 128 Gbps) optical interface card is installed only in one side PCIe x16 slot of two PCIe x16 slots corresponding to the two extension modules 24-1 and 24-2 of the extension storage module in each of the server and the storage system. Then, the PCIe x16 (Gen.3, 128 Gbps) optical interface cards are connected using two PCIe x8 optical cables.

[Primary Storages P1 to P4]

As an application example of a storage system extension of the present invention in which four 64-bay storage P1 to P4 connected to two servers 600-1 and 600-2 are connected, each storage includes two storage extension modules 24-1 and 24-2, and any PCIe x4 extension node of the first storage extension module 24-1 of the primary storage P1 to P4 is connected to a subordinate PCIe x8 connector (or a connector of a PCIe x8 interface card) of a PCIe x16 interface card of the second storage extension module 24-2 using a PCIe x4 optical cable. For reference, plug portions of cable ends of a PCIe x8 optical cable and a PCIe x4 optical cable physically have the same dimension.

As described above, when the rack mount case storage system having the detachable body 1 is applied such that the front case 100 and the rear case are detachable or couplable and electronic components are mounted thereon, the rear part provided with most main controllers of the storage system may maintain a continuous available state in a manner in which the rear part is coupled to a new front part. A front part mounted with storage media may be coupled to the rear case 200 mounted with only the power supply module 209 and may include a separate storage rack to be used for storing long term data.

In this case, the second storage media 207-1 and 207-2, which are mounted on two rear 3.5-inch bays disposed in the rear part, are moved to four 3.5-inch replacement bays (not shown) provided at a lower end of the unit bay-row board 127 of the front case 100, and thus, the front case 100 includes bays on which a total of 64 3.5-inch storage media are mounted. As a result, the rear case 200 mounted with only the power supply module 209 for long term preservation of storage media does not need to include a separate bay for the second storage medium 207 and thus has a simple configuration.

In order to improve performance of a storage system, an SSD-based storage should be gradually used. However, a NAND flash memory, which is currently used as a unit storage element, has a problem in that, due to physical properties, in a state in which power is not applied, a gate maintaining a data storage state is gradually degraded and thus dada is eventually lost after a period of several weeks or months.

Accordingly, when only the front case having a structure detachable from the rear case of the present invention is mounted on a separate long term storage rack, power may be supplied to a storage medium, and an idle state may be maintained. Accordingly, the storage system may be easily used for long term storage.

That is, in the case of a conventional storage system having a front drawer-type storage medium loading structure, storage data is recorded in a paper label in full by hand, and the paper label is attached and stored. However, embodiments of the present inventions have technical characteristics in which, in a state in which an LCD board is previously mounted inside the front case, when a USB port and a flash memory are additionally provided in a hardware manner and only an MCU code is partially updated, whether any records are stored may be easily confirmed through a front LCD of a 64-bay storage system mounted on a long term storage rack in stead of a paper-based label.

On the other hand, as embodiments of the present invention, a coupling scheme between the front case 100 and the rear case 200 which constitute the rack mount case storage system having the detachable body will be described with reference to FIG. 8. two slide rails 30 are provided on one side sidewall of the 64-bay storage system 1 with the purpose of dispersing weight generated when a unit storage medium includes a 3.5-inch HDD.

However, in a state in which fixing bolts are half-tightened to slide rail fixing grooves 31 and 33 with respect to a lock-shaped main body, and in a state in which an edge finger constituting the second connection portion 125 of the bay-row board 127-4 in the front part of a 64-bay main body is temporarily coupled to a PCIe x16 connector constituting the third connection portion 21 provided on the power triple board 201 of the rear part 200 of the main body rear face part 200, four upper/lower bolts of the front case 100 and four upper/lower bolts of the rear part 200, which protrude from the slide rails 30 in a semi-fixed state, may be completely tightened to the rail fixing grooves 31 and 33, thereby recovering two bodies into one completed 64-bay storage system 1.

Therefore, availability of the rear case 200 due to a detachable structure of the rack mount case storage system 1 having the detachable body according to the embodiment of the present invention will be described.

When the storage medium 113 is for long term storage and includes only an HDD according to a type and application method of the storage medium 113 mounted on the front case 100, the rear case not including a separate built-in component is assembled to the front case 100. When the storage medium 113 is for long term storage and is configured to include only an HDD or SSD, the rear case mounted with the power supply module is assembled to the front case. When the storage medium 113 is for long term storage and intermittent data access is required, the rear case configured to be mounted with the power supply module as well as the low performance interface card 23 is assembled to the front case 100. When the rack mount case storage system is used as a high performance storage system, the rear case 200 provided with the high performance interface card 23 and the high performance RAID card 217 is assembled to the front case 100. If necessary, the rear case 200 may be configured to be mounted with a bay for the second storage medium 207 the rear mounted storage media bay 207 or the storage extension module 24.

A case in which the rack mount case storage system having the detachable body according to the embodiment of the present invention includes one the front case 100 and one rear case 200 has been described. However, as shown in the accompanying FIG. 6, a configuration of the front case 100 may include only a series of the bay-row boards 127, and as shown in the accompanying FIG. 9, the front case 100 may be formed in a multi-stage such that a first front case 100-1+a second front case 100-2+ . . . +an $n^{th}$ front case 100-$n$ are formed with respect to one rear case 100 and a front panel unit 10 including the LCD signal extension board 101, the LCD board 103, the power switch 105, and the front cooling fan 107 coupled to a rear surface of a front panel is finally coupled to a boundary portion 22-$n$ of the $n^{th}$ front case 100-$n$ at a final stage. Therefore, it is possible to form the rack mount case storage system having the detachable body according to the embodiment of the present invention.

As described above, in the case of a structure in which at least three front cases of the rack mount case storage system having the detachable body 1 according to the embodiment of the present invention are coupled, in order for the rack mount case storage system to be mounted on a standard rack used in a data center or the like, a rack system, in which a deep of a rack is changed to correspond to a length of the front case formed in a multi-stage, may be used. Alternatively, the standard rack may be configured such that the rack mount case storage system is installed on a rack having a shape in which at least two standard rack (not shown) are coupled to each other in the same manner as a multi-configuration of the front case 100 as in the rack mount case storage system having the detachable body 1 according to the embodiment of the present invention.

However, in order to easily install or maintain the storage system of the present invention installed in such a couple type rack (not shown), a support (not shown) having a trapezoidal shape or a support having a separated shape may be provided to be foldably fixed to a lower end of the $n^{th}$ front case 100-$n$ of the present invention. When the rack mount case storage system having the detachable body 1 according to the embodiment of the present invention is mounted on the rack system (not shown), the foldable support (not shown) or support having the separated shape may have a structure in which a length or height thereof is adjusted according to a height of the couple type rack (not shown).

Although the technical spirit of the rack mount case storage system having the detachable body 1 which has a detachable structure of the present invention has been described with reference to the accompanying drawings, the most exemplary embodiment of the present invention is described for illustrative purposes and not for limitation purposes.

The present invention is not limited to specific exemplary embodiments but can be embodied in various forms by people ordinarily skilled in the art without departing from the spirit of the present invention and such modifications may fall within the scope of the claims.

INDUSTRIAL APPLICABILITY

In a hybrid storage system based on a high capacity rack mount case, a 3.5-inch storage medium (for example, an HDD, SSD doubler, or the like) based on a SATA interface and an SSD-based 3.5-inch storage medium (for example, an SSD tripler, M2 multiplier, or the like) can be selectively accommodated by a user, and thus, one or more front cases having a 64-bay hybrid bay structure can be formed in a multi-stage. In addition, if needed, it is possible to provide a rack mount case storage system having a detachable body used by detaching or coupling a part mounted with a series of storage media and a control part including a power supply module. It is possible to form a 64-bay hybrid bay structure by commonly accommodating an SSD-based storage medium (for example, an HDD, SSD doubler, or the like) based on a SATA interface and an SSD-based storage medium (for example, an SSD tripler, M2 multiplier, or the like.) based on a PCIe interface. Furthermore, if needed, storage media can be separated and used.

The invention claimed is:

1. A rack mount case comprising:
   a front case which accommodates a first storage medium and includes a bay-row board having a multi-stage arrangement structure and including a first connection portion and a second connection portion for a connection with adjacent board;
   one or more power supply modules;
   a power multiplexing board which includes a power supply module connection portion connected to correspond to the power supply module and a third connection portion configured to connect power and an interface signal to the front case, wherein the third connection portion is connected to the second connection portion which is adjacent thereto and is provided in the front case, receives power supplied from the power supply module, and supplies the received power to the front case;

a rear case which includes the power supply modules and the power multiplexing board; and a slide rail portion which is fixed to each of both side surfaces of the front case and the rear case and couples the front case and the rear case, wherein the front case or the rear case is detached or coupled as needed.

2. A rack mount case storage system having a detachable body, comprising:

a front case which accommodates a first storage medium, includes a bay-row board having a multi-stage arrangement structure and including a first connection portion and a second connection portion for a connection with adjacent board, and is configured such that one or more front cases are coupled;

one or more power supply modules;

a power multiplexing board which includes a power supply module connection portion connected to correspond to the power supply module and a third connection portion configured to connect power and an interface signal to the front case, wherein the third connection portion is connected to the second connection portion which is adjacent thereto and is provided in the front case, receives power supplied from the power supply module, and supplies the received power to the front case;

a rear case which includes the power supply modules and the power multiplexing board; and a slide rail portion which is fixed to each of both side surfaces of the front case and the rear case and couples the front case and the rear case, wherein the front case or the rear case is detached or coupled as needed.

3. The rack mount case storage system of claim 2, wherein the rear case including the power multiplexing board further includes a fourth connection portion which protrudes in a direction opposite to the third connection portion and transmits power and an interface signal.

4. The rack mount case storage system of claim 3, further comprising a base board which is coupled to the fourth connection portion provided on the power multiplexing board and includes a peripheral component interconnect (PCI) express slot for an external interface and a PCI express slot for an internal interface to form a controller, wherein a PCI express slot portion is formed outside the rear case so as to correspond to the PCI express slot.

5. The rack mount case storage system of claim 4, wherein at least one rear 2-bay module configured to mount a second storage medium is mounted at an upper end of the rear case, wherein power and an interface control signal is connected between the rear 2-bay module and the base board through a vertical connection board which is further provided.

6. The rack mount case storage system of claim 5, wherein the first storage medium and the second storage medium are concurrently accommodated only in the front case by mounting the second storage medium provided at the upper end of the rear case on a second storage medium corresponding bay provided at a lower end of the front case.

7. The rack mount case storage system of claim 4, further comprising a storage extension module which is connected to a PCI express slot provided to be used for an extension module provided on the base board.

8. The rack mount case storage system of claim 4, further comprising one or more PCI express slot connectors which are connected to at least one PCI express slot connector constituting the PCI express slot portion provided on the base board through an electric circuit wiring and is disposed in a direction of 90° such that a redundant array of independent disk (RAID) card is mounted.

9. The rack mount case storage system of claim 8, wherein a cooling fan is provided on a front surface of a bracket of the RAID card such that an air flow is parallel to a direction of the RAID card.

10. The rack mount case storage system of claim 2, wherein the power multiplexing board further includes a power extension board between the power supply module and the power supply module connection portion so as to correspond to a length of the power supply module and connects the power supply module and the power supply module connection portion.

11. The rack mount case storage system of claim 2, wherein a main body grip hole is formed in a central upper end point of each of both side surfaces of the front case to provide convenience when the front case is installed and is covered by a covering portion such as a slide rail when a product is installed.

12. The rack mount case storage system of claim 3, wherein, according to a use purpose of the first storage medium mounted on the front case, when the first storage medium of the front case is for long term storage, the rear case is mounted with only the power supply module on the power multiplexing board and is coupled to the front case, when the first storage medium is stored for a long term and intermittent data access is required, the rear case includes the power supply module, the base board connected to the fourth connection portion, a low performance interface card, and a lower performance RAID card mounted on the base board and is coupled to the front case, and normally, the rear case includes the power supply module, the base board connected to the fourth connection portion, a high performance interface card, and a high performance RAID card mounted on the base board and is coupled to the front case.

* * * * *